(12) United States Patent
Bailey et al.

(10) Patent No.: US 7,511,505 B1
(45) Date of Patent: Mar. 31, 2009

(54) CENTRALIZED CONNECTOR MODULE HAVING COMPONENT DIAGNOSTIC CAPABILITY, REFRIGERATION UNIT INCORPORATING THE SAME AND METHODS OF ASSEMBLING AND TROUBLESHOOTING A REFRIGERATION UNIT

(75) Inventors: Patrick M. Bailey, Snellville, GA (US); Raynald C. Clarke, Snellville, GA (US)

(73) Assignee: Heatcraft Refrigeration Products LLC, Stone Mountain, GA (US)

( * ) Notice: Subject to any disclaimer, the term of this patent is extended or adjusted under 35 U.S.C. 154(b) by 28 days.

(21) Appl. No.: 10/738,319

(22) Filed: Dec. 17, 2003

(51) Int. Cl.
  *G01R 31/14* (2006.01)
  *G01R 31/04* (2006.01)
  *G08B 21/00* (2006.01)
  *H01R 3/00* (2006.01)
  *H02H 5/04* (2006.01)
  *F25B 49/00* (2006.01)

(52) U.S. Cl. .................. 324/511; 324/538; 340/638; 439/489; 361/104; 62/125

(58) Field of Classification Search ............ 324/511, 324/538
  See application file for complete search history.

(56) References Cited

U.S. PATENT DOCUMENTS

| | | | | |
|---|---|---|---|---|
| 3,728,616 A | * | 4/1973 | Cheek et al. ............... | 324/538 |
| 4,799,019 A | * | 1/1989 | Cooley et al. ............... | 324/546 |
| 5,285,163 A | * | 2/1994 | Liotta ........................ | 324/508 |
| 5,689,191 A | * | 11/1997 | Kashiyama ................. | 324/538 |
| 5,986,558 A | * | 11/1999 | Crawford et al. ........... | 340/638 |
| 6,075,448 A | * | 6/2000 | Verkhovskiy ............... | 340/657 |
| 6,124,716 A | * | 9/2000 | Kanamori ................... | 324/538 |
| 6,323,652 B1 | * | 11/2001 | Collier et al. ............... | 324/508 |
| 6,373,255 B2 | * | 4/2002 | Tury et al. .................. | 324/414 |
| 6,441,637 B1 | * | 8/2002 | Neeb .......................... | 324/771 |
| 6,496,015 B2 | * | 12/2002 | Stanford et al. ............ | 324/541 |
| 6,960,917 B2 | * | 11/2005 | Parker et al. ................ | 324/538 |
| 2005/0207079 A1 | * | 9/2005 | Tiller et al. ................... | 361/64 |

OTHER PUBLICATIONS

CyberPower User Manual for CPS700AVR, dated therefore Dec. 31, 2001, 15 pages.*

\* cited by examiner

*Primary Examiner*—Timothy J Dole
*Assistant Examiner*—Jeff Natalini

(57) ABSTRACT

A centralized connector module, a refrigeration unit and a method of assembling a refrigeration unit. In one embodiment, the centralized connector module includes (1) a dielectric body having interconnected terminal sets corresponding to components connectable thereacross and (2) continuity indicator circuits associated with at least some of the terminal sets and configured to indicate continuity faults with respect to connected ones of the components.

26 Claims, 3 Drawing Sheets

CENTRALIZED CONNECTOR MODULE HAVING COMPONENT DIAGNOSTIC CAPABILITY, REFRIGERATION UNIT INCORPORATING THE SAME AND METHODS OF ASSEMBLING AND TROUBLESHOOTING A REFRIGERATION UNIT

TECHNICAL FIELD OF THE INVENTION

The present invention is directed, in general, to terminal blocks for electrical equipment and, more specifically, to a centralized connector module having a component diagnostic capability, a refrigeration unit incorporating the same and methods of assembling and troubleshooting a refrigeration unit.

BACKGROUND OF THE INVENTION

Refrigeration systems typically include an outside, or condensing unit, and an indoor, or evaporating unit (also know as an "air handler"). Indoor units are mounted inside a cooler or freezer box. Outdoor units, on the other hand, may be installed on a roof or on the ground. Due to restricted access to the units, installation and service of refrigeration systems can be difficult.

Once access to the refrigeration system is obtained, access to the components of each unit can also be difficult. The components are typically compactly placed within each unit to conserve space and are often inaccessible through one opening. Thus, confirming proper connections during installation can be difficult and may require the removal of several panels. Troubleshooting during service calls can be even more difficult due to dirt build-up that hides connections and covers components. Determining which component has failed, what caused the failure or did more than one component fail becomes time consuming and costly. Adding to the difficulty of service calls, refrigeration systems seem to fail during the hottest days of the summer.

Troubleshooting during manufacturing can also be time consuming and difficult. Wiring of each of the components and proper operation of each of the components must be confirmed. Since each component is typically individually wired, this requires skilled labor to read and understand the wiring diagrams.

Accordingly, what is needed in the art is a refrigeration system that is easier to manufacture and service.

SUMMARY OF THE INVENTION

To address the above-discussed deficiencies of the prior art, the present invention provides a centralized connector module, a refrigeration unit and a method of assembling a refrigeration unit. In one embodiment, the centralized connector module includes (1) a dielectric body having interconnected terminal sets corresponding to components connectable thereacross and (2) continuity indicator circuits associated with at least some of the terminal sets and configured to indicate continuity faults with respect to connected ones of the components.

The centralized connector module provides a common termination point for components or circuits within, for example, a refrigeration unit. Additionally, the centralized connector module indicates continuity faults. A continuity fault may be an open electrical circuit. The continuity indicator circuits, therefore, may be configured to inform which of the components connected to the associated terminal sets are open. This enables field service personnel making a service call to have specific and accurate feedback as to which component is open and caused a failure of the refrigeration unit. Without the centralized connector module, the field service personnel would have to isolate and check each component individually. Thus, even though the centralized connector module does not control operation of the components, the centralized connector module provides a single location to indicate possible component failure.

The centralized connector module also improves manufacturing by simplifying wiring with a dedicated place for terminating components. This improves manufacturing and equipment quality with faster, error-free wiring during assembly of the refrigeration units. Additionally, the continuity indicator circuits provide instant feedback on wiring errors or failed components when manufacturing. The present invention, therefore, improves troubleshooting for service calls and for manufacturing by providing a centralized diagnostic tool.

In another embodiment, the present invention provides a refrigeration unit including (1) a frame having a service panel, (2) a compressor component coupled to the frame, (3) at least one sensor component coupled to the frame, (4) a fan component coupled to the frame, (5) a timer component coupled to the frame and (6) a centralized connector module located proximate the service panel including (6a) a dielectric body having interconnected terminal sets corresponding to the compressor component, the at least one sensor component, the fan component and the timer component and (6b) continuity indicator circuits associated with at least some of the terminal sets and configured to indicate continuity faults with respect to the refrigeration unit.

In yet another embodiment, the present invention provides a method of assembling a refrigeration unit including (1) mounting a centralized connector module to a frame proximate a service panel thereof, the module including a dielectric body having interconnected terminal sets and continuity indicator circuits associated with at least some of the terminal sets, (2) mounting a compressor component to the frame, (3) mounting a compressor controller component to the frame, (4) connecting leads of the compressor controller component to one of the interconnected terminal sets, (5) connecting leads from the compressor controller component to the compressor component, (6) mounting at least one sensor component to the frame, (7) connecting leads of the at least one sensor component to at least one other of the interconnected terminal sets (8) mounting a fan component to the frame, (9) connecting leads of the fan component to another one of the interconnected terminal sets, (10) mounting a timer component to the frame and (11) connecting the leads of the timer component to yet another one of the interconnected terminal sets. In this yet another embodiment, the continuity indicator circuits of the centralized connector module are configured to indicate continuity faults with respect to the refrigeration unit.

In yet one other embodiment, the present invention provides a method of troubleshooting a refrigeration unit including (1) opening a service panel of the refrigeration unit to reveal a centralized connector module that includes a dielectric body having interconnected terminal sets corresponding to components connectable thereacross and continuity indicator circuits associated with at least some of the terminal sets and configured to indicate continuity faults with respect to connected ones of the components, and (2) localizing a malfunction in the refrigeration unit based on a status of the continuity indicator circuits.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
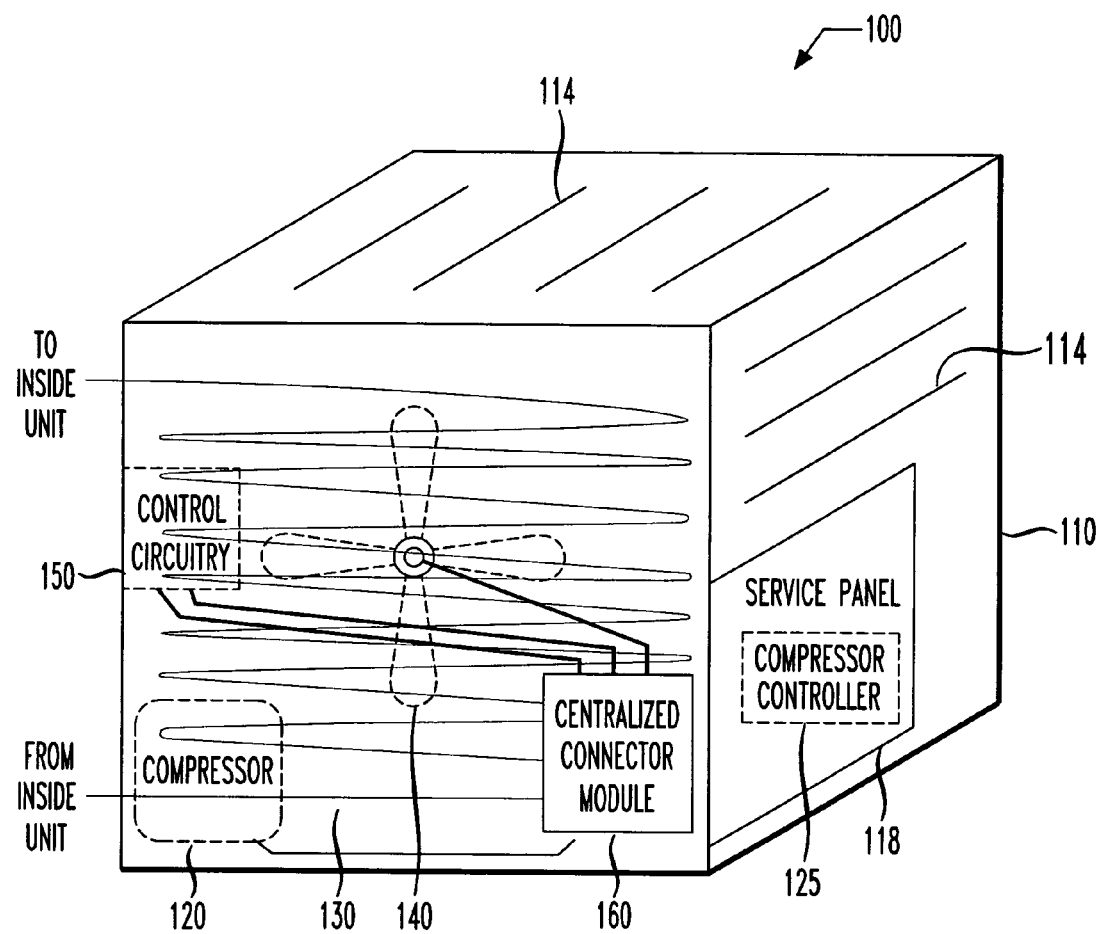
FIG. 1 illustrates a block diagram of a refrigeration unit constructed in accordance with the principles of the present invention.

Referring initially to FIG. 1, illustrated is a block diagram of a refrigeration condensing unit, generally designated 100, constructed in accordance with the principles of the present invention. The condensing unit 100 includes a frame 110, a compressor 120, a compressor controller 125, a condenser 130, a fan 140, control circuitry 150 and a centralized connector module 160.

The condensing unit 100 is an outdoor unit of a refrigeration system. The principles of the present invention, however, apply to other refrigeration units, such as an indoor unit, and other refrigeration systems, such as commercial and industrial refrigeration systems. The condensing unit 100 is conventionally coupled to an indoor unit of the refrigeration system. One skilled in the art will understand that the condensing unit 100 may include additional components not illustrated or discussed that are commonly employed within conventional condensing units.

The frame 110 provides protection and support for components of the condensing unit 100. The frame 110 is constructed of a heavy-gauge, galvanized steel that is protected by a baked-on finish for a corrosion-resistant product. The frame 110 includes support feet and drainage holes to raise the condensing unit 100 off the ground and reduce moisture damage. A portion of the frame 110 includes a coil guard 114 that protects the condenser 130 while maintaining efficiency of the condensing unit 100. The frame 110 also includes a service panel 118 that allows access to the centralized connector module 160 without removing sides of the frame 110. The easy access to the centralized connector module 160 and the compressor controller 125 via the service panel 118 allows a simple diagnostic check of the condensing unit 100 during manufacturing, installation or service calls.

The compressor 120 coupled to the frame 110, compresses a refrigerant, such as Freon, causing it to become a hot, high-pressured gas. The compressor 120 may be coupled to the centralized connector module 160 via the compressor controller 125. The compressor controller 125, coupled to the compressor 120 and the centralized connector module 160, is configured to provide voltage to the compressor 120. The compressor controller 125 may be a contactor. Typically, the compressor controller 125 is easily accessible via the service panel 118. The condenser 130 coupled to the compressor 120 is a heat transfer coil having multiple passes that allows removal of heat obtained by the refrigerant from the inside unit to the environment. The fan 140 moves air across the condenser 130 to facilitate the heat transfer. The compressor 120, the compressor controller 125, the condenser 130 and the fan 140 may be conventional components typically employed within common condensing units.

The control circuitry 150 protects the components of the condensing unit 100. The control circuitry 150 includes sensors that detect, for example, low pressure or high pressure of the refrigerant. Additionally, the control circuitry 150 includes a timer that prevents the compressor 120 from tripping off prematurely when the outside air temperature is cold. One skilled in the art will understand that the control circuitry 150 may include additional sensors or timers. Typically, the control circuitry 150 includes components of an electrical safety circuit employed to protect, for example, the compressor 120, the condenser 130 and the fan 140. In some embodiments, the control circuitry 150 may be coupled to sensors or timers located in the inside unit.

The centralized connector module 160, located proximate the service panel 118 provides a common termination point for the components of the condensing unit 100 that simplifies connecting the components during manufacturing and servicing. The centralized connector module 160 includes a dielectric body and continuity indicator circuits. The dielectric body has interconnected terminal sets corresponding to the compressor 120, the condenser 130, the fan 140 and sensors and timers of the control circuitry 150. The terminal sets may be marked with an identification to designate which component to connect thereacross. This further simplifies connecting the components and provides a simple visual check to confirm each necessary component is installed.

At least some of the terminal sets are interconnected in series. One terminal set may be connected to two components coupled in parallel. Some of the terminal sets are coupled to voltage indicator circuits configured to indicate operation of corresponding components coupled to thereacross. One particular voltage indicator circuit is configured to indicate the receipt of AC power to the centralized connector module 160. Each of the terminal sets remain functional upon a failure of any of the continuity indicator circuits. Thus, the centralized connector module 160 does not provide control for components coupled thereto.

The continuity indicator circuits are associated with at least some of the terminal sets and configured to indicate continuity faults with respect to the condensing unit 100. The number of continuity indicator circuits may vary for different embodiments. Each of the continuity indicator circuits includes an impedance, a half-wave rectifier and a light-emitting diode (LED). The impedance for each of the continuity indicator circuits is selected to control the light intensity of the corresponding LED. Thus, the impedance for each of the continuity indicator circuits may be chosen based on a rating of the LED.

The centralized connector module 160 provides a diagnostic tool that simplifies troubleshooting. Since the centralized connector module 160 is readily accessible via the service panel 118, a service technician can open the service panel 118 to reveal the centralized connector module 160 and localize a malfunction in the condensing unit 100 based on a status of the continuity indicator circuits. The service technician can also verify the proper operation of components coupled to the centralized connector module 160 based on a status of voltage indicator circuits.

Figure 2:
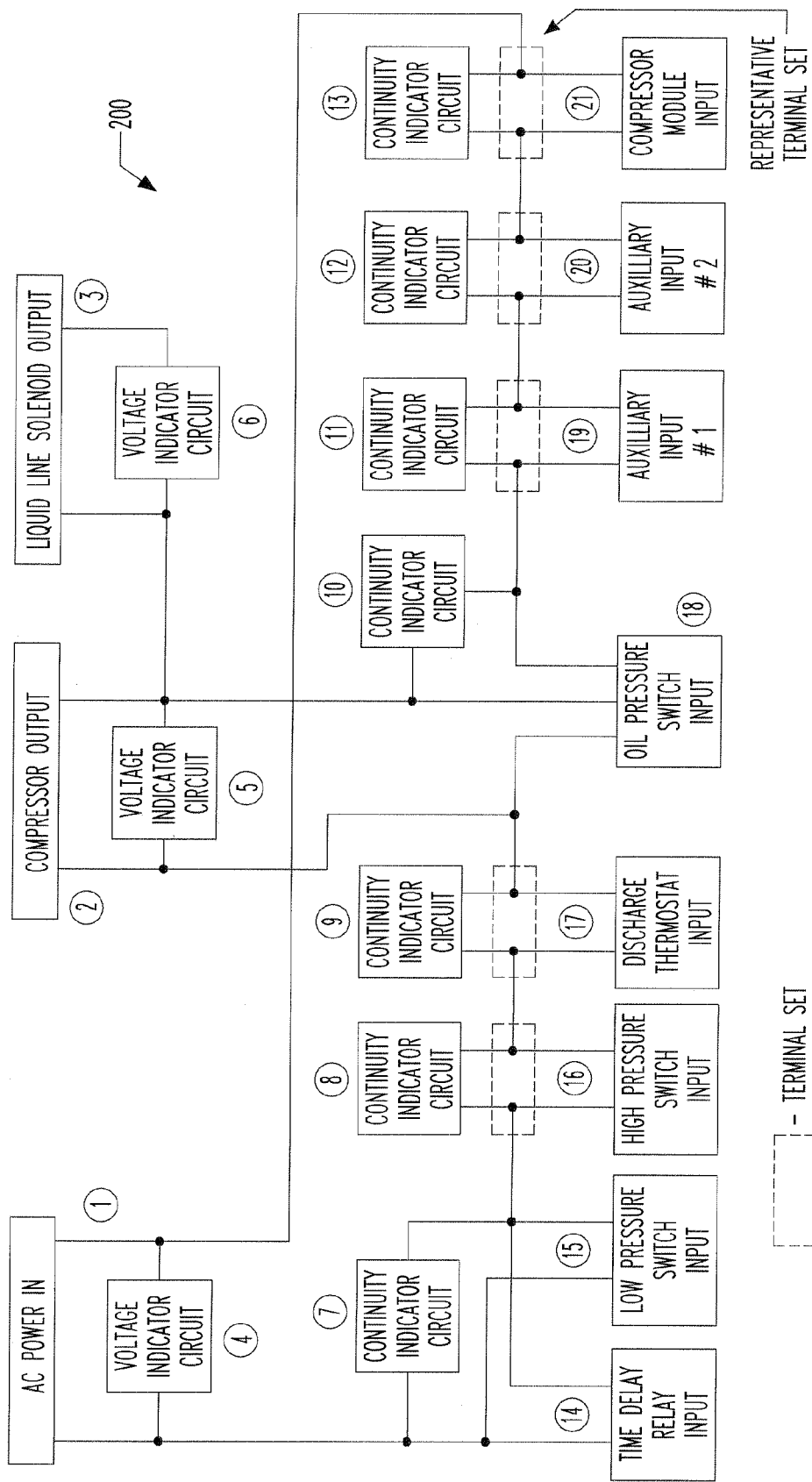
FIG. 2 illustrates a block diagram of a centralized connector module constructed in accordance with the principles of the present invention.

Turning now to FIG. 2, illustrated is a block diagram of a centralized connector module, generally designated 200, constructed in accordance with the principles of the present invention. The centralized connector module 200 includes a dielectric body having interconnected terminal sets, continuity indicator circuits and voltage indicator circuits. In FIG. 2, each of the terminal sets is represented by a pair of nodes with one such set identified as a representative terminal set. The continuity indicator circuits, the voltage indicator circuits and components coupled thereacross the terminal sets are identified by text and numbers. The centralized connector module 200 may be employed in a condensing unit such as illustrated in FIG. 1.

The centralized connector module 200 includes a terminal set for incoming AC power, AC Power In 1, and a voltage indicator circuit 4 associated therewith that is configured to indicate a presence of voltage across the terminal set. The centralized connector module 200 also includes a voltage indicator circuit 5 for a compressor output 2 and a voltage indicator circuit 6 for a liquid line solenoid output 3. The voltage indicator circuit 5 is configured to indicate an operation of the corresponding compressor output 2. The voltage indicator circuit 6 is configured to indicate that voltage is being provided to the liquid line solenoid output 3.

The voltage indicator circuits include an impedance, a half-wave rectifier and an LED. The LED of each of the voltage indicator circuits is green and is illuminated to indicate a presence of a voltage thereacross or to indicate an operation of corresponding ones of the components. For example, the LED of the voltage indicator circuit 4 will be illuminated green to indicate AC power across the corresponding terminal set. The impedance for each of the voltage indicator circuits is sized according to a target current of the LED in order to obtain sufficient light intensity.

The centralized connector module 200 also includes continuity indicator circuits, designated 7-13, associated with the terminal sets and components connected thereacross. The continuity indicator circuits also include an impedance, a half-wave rectifier and an LED. As with the voltage indicator circuits, the impedance of the continuity indicator circuits is selected for a target current of the LED in order to obtain sufficient light intensity. For example, an impedance of the continuity indicator circuit 13 is based on the type of LED used therein. Unlike the voltage indicator circuits, the LEDs of the continuity indicator circuits are red and are illuminated to indicate which corresponding component has caused a continuity fault, such as, an open electrical circuit.

The continuity indicator circuit 7 is configured to indicate a continuity fault with respect to the parallel-connected components time delay relay input 14 and low-pressure switch input 15. The continuity indicator circuits 8, 9 are configured to indicate a continuity fault with respect to a single component, high pressure switch input 16 and discharge thermostat input 17, respectively. Similarly, continuity indicator circuits 10, 11, 12, 13 are also configured to indicate continuity faults with respect to a single associated component. More specifically, continuity indicator circuit 10 is associated with an oil pressure switch input 18, continuity indicator circuit 11 is associated with a first auxiliary input 19, continuity indicator circuit 12 is associated with a second auxiliary input 20 and continuity indicator circuit 13 is associated with a compressor module input 21.

The terminal sets of the centralized connector module 200 remain functional upon a failure of any of the continuity indicator circuits or voltage indicator circuits. Thus, the centralized connector module 200 does not control the components coupled thereacross the terminal sets but provides a central termination location and a diagnostic tool for troubleshooting during manufacturing, installation or service calls. Illuminated green LEDs, for example, may indicate proper operation of the condensing unit. As stated previously, when power is applied to the centralized connector module 200, the green LED of the voltage indicator circuit 4 is illuminated. Additionally, when there is a call for cooling, the green LEDs of the voltage indicator circuits 5, 6, are illuminated to indicate activation of the compressor output 2 and the liquid line solenoid output 3.

Wiring of a room thermostat, located inside a refrigerated space, is in series with wiring for the liquid line solenoid. When the room thermostat reaches a target temperature, the series circuit opens and the liquid line solenoid deactivates. This causes the flow of refrigerant to the system evaporator to stop. The return pressure from the evaporator to the condenser will drop until the low-pressure switch circuit opens. When the low-pressure switch opens, continuity indicator circuit 7 turns on and the compressor output 2 and associated voltage indicator circuit 5 turn off. Voltage indicator circuit 6 remains on, indicating that power is available for the liquid line solenoid to reactivate as soon as the room thermostat switch closes. Thus, the connector module 200 may have the green LED associated with voltage indicator circuit 5 turned off with the red LED associated with continuity indicator circuit 7 turned on while the system is operating properly.

During cooling, if any of the components coupled across one of the terminal sets associated with one of the continuity indicator circuits experiences an open circuit, either individually or collectively, the corresponding red LED of continuity indicator circuits 7-13, will illuminate to indicate which component has the open circuit. Following this, the compressor circuit would de-energize and the green LED of voltage indicator circuit 5 would turn off. Additionally if the component that experiences the open circuit was associated with continuity indicator circuits 18-21, the green LED of voltage indicator circuit 6 would turn off. When the faulty component circuit is corrected, the corresponding red LED of continuity indicator circuit 7-13 would turn off. The liquid line solenoid and compressor would be re-energized and the green LED of voltage indicator circuits 5, 6, would be illuminated.

In other embodiments, the centralized connector module 200 may be configured differently. For example, the centralized connector module 200 may have more or less terminal sets and may have different components coupled across each of the terminal sets as compared to FIG. 2. Additional colored LEDs may also be employed to indicate continuity faults caused by specific components. One skilled in the art will understand that different configurations are possible.

Figure 3:
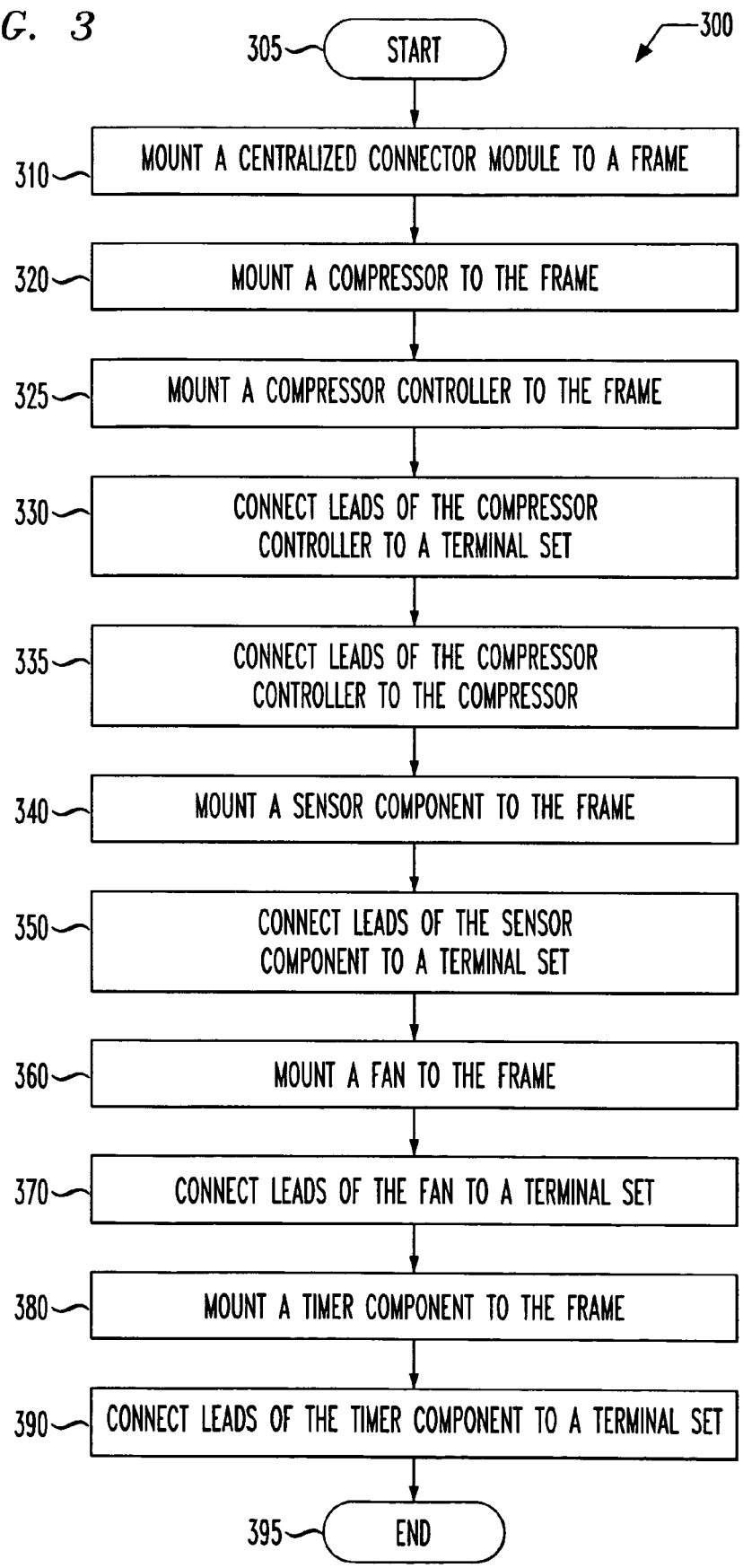
FIG. 3 illustrates a method of assembling a refrigeration unit carried out in accordance with the principles of the present invention.

Turning now to FIG. 3, illustrated is a method of assembling a refrigeration unit, generally designated 300, carried out in accordance with the principles of the present invention. The method 300 begins in a step 305 with an intent to assemble a refrigeration unit.

After beginning, a centralized connector module is mounted proximate a service panel in a step 310. The centralized connector module, in addition to other components, may be mounted to the frame using conventional methods. The centralized connector module includes a dielectric body having interconnected terminal sets and continuity indicator circuits associated with at least some of the terminal sets. At least some of the terminal sets are interconnected in series. All of the terminal sets remain functional upon a failure of any of the continuity indicator circuits.

The continuity indicator circuits of the centralized connector module are configured to indicate continuity faults with respect to the refrigeration unit. The continuity indicator circuits may indicate a continuity fault for a single corresponding component or for multiple components.

The centralized connector module also includes output terminal sets and associated voltage indicator circuits that are configured to indicate an operation of corresponding ones of the components. One voltage indicator circuit is configured to indicate a presence of a voltage across at least one of the terminal sets. For example, one voltage indicator circuit may be across an output terminal set to indicate the receipt of AC power to the centralized connector module. The voltage indicator circuits and the continuity indicator circuits include LEDs. The color of the LEDs may vary to indicate specific failures or operations.

Upon mounting the centralized connector module, a compressor is mounted to the frame in a step 320. The compressor may be a conventional compressor of a condensing unit. Next, a compressor controller is mounted to the frame in a step 325. The compressor controller may be mounted proximate the service panel. The compressor controller may be a contactor to provide power to and protection for the compressor. After mounting the compressor and the compressor controller, leads of the compressor controller are connected to one of the interconnected terminal sets in a step 330. A terminal set may be clearly marked to receive the compressor controller leads. Next, leads from the compressor controller are connected to the compressor in a step 335.

After connecting the compressor controller leads to the compressor, a sensor component is mounted to the frame in a step 340. The sensor component may be associated with the compressor. Additionally, the sensor component may be a component of an electrical safety circuit commonly employed to protect refrigeration equipment. After mounting the sensor component, leads of the sensor component are connected to one of the other of the interconnected terminal sets in a step 350.

After connecting the sensor component leads, a fan is mounted to the frame in a step 360. Upon mounting the fan, leads of the fan are connected to one of the other interconnected terminal sets in a step 370. A timer component is then mounted to the frame in a step 380. The timer component may be another component of the electrical safety circuit. The leads of the timer component are then connected to yet another one of the interconnected terminal sets in a step 390. After connecting the timer component leads, the method of assembling a refrigeration unit ends in a step 395.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. A centralized connector module, comprising:
    a dielectric body having interconnected terminal sets corresponding to components connectable thereacross and configured to provide terminating points for said components for continuous operation thereof, said centralized connector module incapable of controlling said components; and
    continuity indicator circuits integrated within said dielectric body and associated with at least some of said terminal sets, said continuity indicator circuits configured to indicate continuity faults with respect to connected ones of said components.

2. The module as recited in claim 1 wherein at least some of said terminal sets are interconnected in series and said continuity indicator circuits include light-emitting diodes.

3. The module as recited in claim 1 wherein said continuity indicator circuits have impedances based on illuminating associated light-emitting diodes.

4. The module as recited in claim 1 further comprising an AC Power In terminal set and a voltage indicator circuit associated therewith and configured to indicate a presence of a voltage thereacross.

5. The module as recited in claim 1 further comprising output terminal sets and voltage indicator circuits associated therewith and configured to indicate an operation of corresponding ones of said components.

6. The module as recited in claim 1 wherein said terminal sets remain functional upon a failure of any of said continuity indicator circuits.

7. The module as recited in claim 1 wherein at least one of said continuity faults represent an open electrical circuit with respect to at least one of said connected ones of said components.

8. A refrigeration unit, comprising:
    a frame having a service panel;
    a compressor component coupled to said frame;
    at least one sensor component coupled to said frame;
    a fan component coupled to said frame;
    a timer component coupled to said frame; and
    a centralized connector module located proximate said service panel and including:
        a dielectric body having interconnected terminal sets corresponding to said compressor component, said at least one sensor component, said fan component and said timer component said dielectric body configured to provide terminating points for each of said components for continuous operations thereof, said centralized connector module incapable of controlling said components, and
    continuity indicator circuits integrated within said dielectric body and associated with at least some of said terminal sets, said continuity indicator circuits configured to indicate continuity faults with respect to said components.

9. The unit as recited in claim 8 wherein at least some of said terminal sets are interconnected in series.

10. The unit as recited in claim 8 wherein said continuity indicator circuits include light-emitting diodes.

11. The unit as recited in claim 8 wherein said continuity indicator circuits have impedances based on illuminating associated light-emitting diodes.

12. The unit as recited in claim 8 further comprising an AC Power In terminal set and a voltage indicator circuit associated therewith and configured to indicate a presence of a voltage thereacross.

13. The unit as recited in claim 8 further comprising output terminal sets and voltage indicator circuits associated therewith and configured to indicate an operation of corresponding ones of said components.

14. The unit as recited in claim 8 wherein said terminal sets remain functional upon a failure of any of said continuity indicator circuits.

15. A method of assembling a refrigeration unit, comprising:
mounting a centralized connector module to a frame proximate a service panel thereof, said module including:
a dielectric body having interconnected terminal sets corresponding to components connectable thereacross and configured to provide terminating points for said components for continuous operation thereof, said centralized connector module incapable of controlling said components, and
continuity indicator circuits integrated within said dielectric body and associated with at least some of said terminal sets, said continuity indicator circuits configured to indicate continuity faults with respect to connected ones of said components;
mounting a compressor component to said frame;
mounting a compressor controller component to said frame;
connecting leads of said compressor component to said compressor controller component;
connecting leads of said compressor controller component to one of said interconnected terminal sets;
mounting at least one sensor component to said frame;
connecting leads of said at least one sensor component to at least one other of said interconnected terminal sets;
mounting a fan component to said frame;
connecting leads of said fan component to an other one of said interconnected terminal sets;
mounting a timer component to said frame; and
connecting leads of said timer component to yet one other of said interconnected terminal sets, said continuity indicator circuits configured to indicate continuity faults with respect to said refrigeration unit.

16. The method as recited in claim 15 wherein at least some of said terminal sets are interconnected in series.

17. The method as recited in claim 15 wherein said continuity indicator circuits include light-emitting diodes.

18. The method as recited in claim 15 wherein said continuity indicator circuits have impedances based on illuminating associated light-emitting diodes.

19. The method as recited in claim 15 wherein said centralized connector module further includes an AC Power In terminal set and a voltage indicator circuit associated therewith and configured to indicate a presence of a voltage thereacross.

20. The method as recited in claim 15 wherein said centralized connector module further includes output terminal sets and voltage indicator circuits associated therewith and configured to indicate an operation of corresponding ones of said components.

21. The method as recited in claim 15 wherein said terminal sets remain functional upon a failure of any of said continuity indicator circuits.

22. A method of troubleshooting a refrigeration unit, comprising:
opening a service panel of said refrigeration unit to reveal a centralized connector module, including:
a dielectric body having interconnected terminal sets corresponding to components connectable thereacross and configured to provide terminating points for
said components for continuous operation thereof, said centralized connector module incapable of controlling said components; and
continuity indicator circuits integrated within said dielectric body and associated with at least some of said terminal sets, said continuity indicator circuits configured to indicate continuity faults with respect to connected ones of said components; and
localizing a malfunction in said refrigeration unit based on a status of said continuity indicator circuits.

23. The method as recited in claim 22 wherein said continuity indicator circuits include light-emitting diodes.

24. The method as recited in claim 22 wherein said centralized connector module further includes an AC Power In terminal set and a voltage indicator circuit associated therewith and configured to indicate a presence of a voltage thereacross.

25. The method as recited in claim 22 wherein said centralized connector module further includes output terminal sets and voltage indicator circuits associated therewith and configured to indicate an operation of corresponding ones of said components.

26. The method as recited in claim 22 wherein said terminal sets remain functional upon a failure of any of said continuity indicator circuits.

\* \* \* \* \*